(12) United States Patent
Motomochi

(10) Patent No.: US 7,176,560 B2
(45) Date of Patent: Feb. 13, 2007

(54) SEMICONDUCTOR DEVICE HAVING A CHIP—CHIP STRUCTURE

(75) Inventor: Kenji Motomochi, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 432 days.

(21) Appl. No.: 10/713,213

(22) Filed: Nov. 17, 2003

(65) Prior Publication Data

US 2004/0188853 A1   Sep. 30, 2004

(30) Foreign Application Priority Data

Jul. 4, 2002   (JP)   ............................. 2002-195681

(51) Int. Cl.
*H01L 23/48*   (2006.01)
*H01L 23/58*   (2006.01)

(52) U.S. Cl. .............................. 257/686; 257/E25.013; 257/E23.179; 257/E25.011; 257/E25.012; 257/777; 257/723; 257/727; 257/724; 257/725; 257/48; 257/679; 257/288; 257/528; 257/690; 257/691; 257/698; 714/744

(58) Field of Classification Search ................. 257/686, 257/685, 723–725, 728, 48, 678, 679, 296, 257/288, 529, 777, 690–692, E25.013, E23.179, 257/E25.011, E25.012; 714/744
See application file for complete search history.

(56) References Cited

U.S. PATENT DOCUMENTS 5,646,422 A * 7/1997 Hashizume ................... 257/48
5,848,003 A * 12/1998 Nishikawa ................... 365/200
6,523,018 B1 * 2/2003 Louis et al. ................... 706/27
6,649,931 B2 * 11/2003 Honma et al. ................. 257/48
2003/0015792 A1   1/2003 Urakawa

* cited by examiner

*Primary Examiner*—Alexander Oscar Williams
(74) *Attorney, Agent, or Firm*—Stevens, Davis, Miller & Mosher, LLP

(57) ABSTRACT

A semiconductor device having a chip-on-chip structure wherein; a first semiconductor chip with a memory macro control circuit where a plurality of inter-chip connection terminals and a plurality of external connection terminals are formed on a surface of the chip; and a second semiconductor chip with memory macro having input/output terminals for the normal operation mode and for the test mode where a plurality of inter-chip connection terminals and a plurality of external connection terminals are formed on a surface of the chip; are adhered to each other in a form so that the surfaces of the chips are opposed to each other and so that the inter-chip connection terminals of the first semiconductor chip and the inter-chip connection terminals of the second semiconductor chip are connected to each other; is provided wherein a multiplexer circuit and a demultiplexer circuit are provided with the first semiconductor chip and the second semiconductor chip so that a signal is inputted to, or is outputted from, the memory macro via the common inter-chip connection terminals by switching signal transmission channels in either case, during normal operation mode or during memory macro test mode which is carried out after the connection of the chips.

30 Claims, 7 Drawing Sheets

SEMICONDUCTOR DEVICE HAVING A CHIP—CHIP STRUCTURE

BACKGROUND OF THE INVENTION

1. Field of the Invention

The present invention relates to a semiconductor device having a chip-on-chip (COC) structure wherein first and second semiconductor chips are adhered to each other in a form so that the surfaces thereof are opposed to each other.

2. Description of the Prior Art

An increase in the performance and functionality of a variety of electronic appliances can be implemented by increasing the performance and functionality of semiconductor devices which are core parts of such electronic appliances. Development of a system-on-chip (SOC) wherein a variety of functional blocks each having a desired function are mounted on a single chip, and at the same time development of a system-in-package (SIP) wherein a plurality of chips is mounted in a three-dimensional form and contained in a package have been making rapid progress recently. In particular, the SIP having a chip-on-chip (COC) structure, have recently attracted special attention due to the possibility for reduction of the mounting area thereof, in comparison with SOC wherein two functional blocks are formed on a single chip; and due the possibility of creating an increase in speed which is equal to or greater than that of SOC.

FIG. 6 is a chip configuration diagram showing an example of a system-on-chip according to a prior art. In this diagram a system-on-chip on which a plurality of functional blocks is mounted is denoted as 11, a memory macro mounted on system-on-chip 11 is denoted as 12, a memory macro control circuit mounted on system-on-chip 11 is denoted as 13, a group of internal signal connection lines for connecting memory macro 12 to memory macro control circuit 13 is denoted as 14, an external connection terminal is denoted as 15, and a group of external signal connection lines for connecting memory macro 12 to external connection terminals 15 is denoted as 16.

The operation of the conventional system-on-chip configured as described above is below described. At the time when the system-on-chip is in a conventional operational mode memory macro 12 operates under the control of memory macro control circuit 13 via group 14 of internal signal connection lines; while at the time when the system-on-chip is in a memory macro test mode, memory macro 12 is tested by an external control signal that is inputted from an external connection terminal 15 via group 16 of external signal connection lines.

The above described conventional semiconductor device, having a system-on-chip structure wherein a plurality of functional blocks that includes a memory macro is mounted on a single chip is considered to be a good product as a semiconductor chip, only in the case wherein all of the functional blocks that have been mounted operate correctly, however, a problem arises wherein the semiconductor chip is regarded as defective in the case wherein any one of the functional blocks that have been mounted is defective and does not operate correctly, even when the majority of functional blocks operate correctly. This problem becomes more significant as the capacity of memory macro that is mounted on the chip is increased, leading to an increase in the area of the chip itself, thus making it difficult to increase the production yield.

As a measure for avoiding such a problem, mounting of a memory macro in one chip together with other functional blocks has been reviewed; and semiconductor devices having a COC structure that is formed of two chips, a memory macro chip and a chip having other functions, have attracted attention in recent years; however the following problem arises in the case wherein a memory macro which has been mounted on a conventional system-on-chip is formed in a separate chip for COC connection.

A memory macro that is mounted on a conventional system-on-chip is, in general, characterized in having a configuration of multiple-bit input/output, and in that the memory macro has a very great number of connection terminals in total, including a great number of internal signal connection terminals for the normal operation mode, and a great number of external signal connection terminals for the memory macro test mode. Therefore a problem arises in the case wherein the above described memory macro is formed in a separate chip for COC connection without changing the specifications thereof, because of the great number of inter-chip connection terminals, which leads to an increase in the areas of the chips and to a reduction in the yield of the product, resulting from defects in the connection between the chips. Here, only the chip on which a memory macro control circuit having a great chip area is mounted, can directly be controlled from the outside after the connection of the chips in the case wherein the memory macro is formed in a separate chip for COC connection without changing the specification thereof wherein the area of the chip on which the memory macro control circuit is mounted, for example, is assumed to be great, while the area of the chip on which the memory macro is mounted is assumed to be small, and therefore the number of inter-chip connection terminals becomes significantly great in order to make it possible for the test of the memory macro itself to be carried out after the connection of the chips, because the terminals for the memory macro test mode are also required to be connected to the terminals of the chips on which the memory macro control circuit is mounted.

SUMMARY OF THE INVENTION

An object of the present invention is to provide a semiconductor device having a COC structure with a high performance and a small chip area wherein possibility of defects in the connection between chips is reduced by implementing a semiconductor chip which uses a COC structure in order to achieve an increase in the production yield and wherein the number of inter-chip connection terminals is reduced leading to a reduction in the chip area.

The present invention provides a semiconductor device having a COC structure wherein first and second semiconductor chips each having circuit blocks are adhered to each other so that the surfaces of the chips are opposed to each other, and so that inter-chip connection terminals on the respective chips are connected to each other, and the semiconductor device is formed so as to be able to achieve the above described object by inserting a multiplexer circuit and a demultiplexer circuit into signal lines that make a connection between a circuit block and inter-chip connection terminals or external connection terminals in each chip, and by switching signal transmission channels depending on the operation modes.

The first semiconductor device according to one embodiment of the present invention is a semiconductor device having a chip-on-chip structure wherein a first semiconductor chip having a circuit block where a plurality of inter-chip connection terminals and a plurality of external connection terminals are formed on a surface of the chip and a second semiconductor chip having a circuit block where a plurality of inter-chip connection terminals and a plurality of external connection terminals are formed on a surface of the chip are adhered to each other in a form wherein the surfaces of the chips are opposed to each other so that the inter-chip connection terminals of the first semiconductor chip and the inter-chip connection terminals of the second semiconductor chip are connected to each other, wherein the first semiconductor chip comprises a first multiplexer circuit for selecting an input signal line from among a plurality of input signal lines so as to output a signal from the selected input signal line to an output signal line, and the output signal line of the first multiplexer circuit is connected to an inter-chip connection terminal of the first semiconductor chip.

According to this configuration one signal line can be selected from among a plurality of signal lines inputted to the first multiplexer circuit so as to be connected to an inter-chip connection terminal of the first semiconductor chip.

Furthermore the present invention may have a configuration wherein at least one input signal line from among the plurality of input signal lines inputted to the first multiplexer circuit is connected to an external connection terminal of the first semiconductor chip.

According to this configuration a signal inputted from an external connection terminal of the first semiconductor chip can be sent to an inter-chip connection terminal of the first semiconductor chip.

In addition, the present invention may have a configuration wherein the first semiconductor chip comprises a first operation mode setting circuit and wherein the first multiplexer circuit is controlled by an operation mode setting signal outputted from the first operation mode setting circuit.

According to this configuration the first multiplexer circuit can select one input signal line from among a plurality of input signal lines that are inputted to the first multiplexer circuit under the control of the operation mode setting signal, and can output a signal from this selected input signal line to an output signal line of the first multiplexer circuit.

In addition, the present invention may have a configuration wherein the first semiconductor chip comprises a first demultiplexer circuit for selecting any one of a plurality of output signal lines, and for outputting a signal from an input signal line to the selected output signal line, and wherein the input signal line inputted to the first demultiplexer circuit is connected to an inter-chip connection terminal of the first semiconductor chip.

According to this configuration a signal from a signal line that is connected to an inter-chip connection terminal of the first semiconductor chip can be selectively outputted to any one of the plurality of output signal lines of the first demultiplexer circuit.

In addition, the present invention may have a configuration wherein at least one output signal line from among the plurality of output signal lines outputted from the first demultiplexer circuit is connected to an external connection terminal of the first semiconductor chip.

According to this configuration a signal line connected to an inter-chip connection terminal of the first semiconductor chip can be connected to an external connection terminal of the first semiconductor chip.

In addition, the present invention may have a configuration wherein the first semiconductor chip comprises a first operation mode setting circuit and wherein the first demultiplexer circuit is controlled by an operation mode setting signal outputted from the first operation mode setting circuit.

According to this configuration a signal from one input signal line that is inputted to the first demultiplexer circuit can be outputted to any one of the plurality of output signal lines that is outputted from the first demultiplexer circuit under the control of the operation mode setting signal.

In addition, the present invention may have a configuration wherein the first semiconductor chip comprises a second demultiplexer circuit for selecting any one of a plurality of output signal lines, and for outputting a signal from an input signal line to the selected output signal line, and wherein at least one output signal line from among the plurality of output signal lines outputted from the second demultiplexer circuit is connected to an external connection terminal of the first semiconductor chip.

According to this configuration a signal line inputted to the second demultiplexer circuit can be connected to an external connection terminal of the first semiconductor chip.

In addition, the present invention may have a configuration wherein at least one output signal line from among the plurality of output signal lines outputted from the second demultiplexer circuit is connected to one of the plurality of input signal lines inputted to the first multiplexer circuit.

According to this configuration a signal line inputted to the second demultiplexer circuit can be connected to any one of the plurality of input signal lines that is inputted to the first multiplexer circuit.

In addition the present invention may have a configuration wherein the first semiconductor chip comprises a first operation mode setting circuit, and wherein the second demultiplexer circuit is controlled by an operation mode setting signal outputted from the first operation mode setting circuit.

According to this configuration a signal from one input signal line that is inputted to the second demultiplexer circuit can be outputted to any one of the plurality of output signal lines that is outputted from the second demultiplexer circuit under the control of the operation mode setting signal.

In addition, the present invention may have a configuration wherein the first semiconductor chip comprises a second multiplexer circuit for selecting an input signal line from among a plurality of input signal lines and for outputting a signal from the selected input signal line to an output signal line, and wherein at least one input signal line from among the plurality of input signal lines inputted to the second multiplexer circuit is connected to an external connection terminal of the first semiconductor chip.

According to this configuration a signal line that is connected to an external connection terminal can be selected from among the plurality of input signal lines that is inputted to the second multiplexer circuit and a signal from the selected signal line can be outputted to an output signal line of the second multiplexer circuit.

In addition, the present invention may have a configuration wherein at least one input signal line from among the plurality of input signal lines inputted to the second multiplexer circuit is connected to one of the plurality of output signal lines outputted from the first demultiplexer circuit.

According to this configuration, a signal line that is connected to any one of the plurality of output signal lines outputted from the first demultiplexer circuit can be selected from among a plurality of input signal lines that is inputted to the second multiplexer circuit, and a signal from the selected signal line can be outputted to an output signal line of the second multiplexer circuit.

In addition, the present invention may have a configuration wherein the first semiconductor chip comprises a first operation mode setting circuit, and wherein the second multiplexer circuit is controlled by an operation mode setting signal outputted from the first operation mode setting circuit.

According to this configuration, one input signal line can be selected from among a plurality of input signal lines that is inputted to the second multiplexer circuit under the control of the operation mode setting signal, and a signal from the selected signal line can be outputted to one output signal line outputted from the second multiplexer circuit.

In addition, the present invention may have a configuration wherein the second semiconductor chip comprises a third demultiplexer circuit for selecting any one of a plurality of output signal lines, and for outputting a signal from an input signal line to the selected output signal line, and wherein the input signal line inputted to the third demultiplexer circuit is connected to an inter-chip connection terminal of the second semiconductor chip.

According to this configuration, a signal from a signal line connected to an inter-chip connection terminal of the second semiconductor chip can be selectively outputted to any one of the plurality of output signal lines outputted from the third demultiplexer circuit.

In addition, the present invention may have a configuration wherein the second semiconductor chip comprises a second operation mode setting circuit, and wherein the third demultiplexer circuit is controlled by an operation mode setting signal outputted from the second operation mode setting circuit.

According to this configuration, a signal from one input signal line that is inputted to the third demultiplexer circuit can be outputted to any one of the plurality of output signal lines outputted from the third demultiplexer circuit under the control of the operation mode setting signal.

In addition, the present invention may have a configuration wherein the second semiconductor chip comprises a third multiplexer circuit for selecting an input signal line from among a plurality of input signal lines and for outputting a signal from the selected input signal line to an output signal line, and wherein the output signal line of the third multiplexer circuit is connected to an inter-chip connection terminal of the second semiconductor chip.

According to this configuration, one signal line can be selected from among the plurality of input signal lines inputted to the third multiplexer circuit so as to be connected to an inter-chip connection terminal of the second semiconductor chip.

In addition, the present invention may have a configuration wherein the second semiconductor chip comprises a second operation mode setting circuit, and wherein the third multiplexer circuit is controlled by an operation mode setting signal outputted from the second operation mode setting circuit.

According to this configuration, one input signal line can be selected from among the plurality of input signal lines inputted to the third multiplexer circuit under the control of the operation mode setting signal, and a signal from the selected signal line can be outputted to one output signal line that is outputted from the third multiplexer circuit.

In addition, the present invention may have a configuration wherein the second semiconductor chip comprises a fourth multiplexer circuit for selecting an input signal line from among a plurality of input signal lines and for outputting a signal from the selected input signal line to an output signal line, and wherein at least one input signal line from among the plurality of input signal lines inputted to the fourth multiplexer circuit is connected to an external connection terminal of the second semiconductor chip.

According to this configuration, a signal line that is connected an external terminal can be selected from among the plurality of signal lines that is inputted to the fourth multiplexer circuit, and a signal from the selected signal line can be outputted to an output signal line of the fourth multiplexer circuit.

In addition, the present invention may have a configuration wherein at least one input signal line from among the plurality of input signal lines inputted to the fourth multiplexer circuit is connected to one of the plurality of output signals outputted from the third demultiplexer circuit.

According to this configuration, a signal line connected to any one of the plurality of output signal lines outputted from the third demultiplexer circuit can be selected from among the plurality of signal lines inputted to the fourth multiplexer circuit, and a signal from the selected signal line can be outputted to an output signal line of the second multiplexer circuit.

In addition, the present invention may have a configuration wherein the second semiconductor chip comprises a second operation mode setting circuit, and wherein the fourth multiplexer circuit is controlled by an operation mode setting signal outputted from the second operation mode setting circuit.

According to this configuration, one input signal line can be selected from among the plurality of input signal lines inputted to the fourth multiplexer circuit under the control of the operation mode setting signal, and a signal from the selected signal line can be outputted to one output signal line that is outputted from the fourth multiplexer circuit.

In addition, the present invention may have a configuration wherein the second semiconductor chip comprises a fourth demultiplexer circuit for selecting any one of a plurality of output signal lines, and for outputting a signal from an input signal line to the selected output signal line, and wherein at least one output signal line from among the plurality of output signal lines outputted from the fourth demultiplexer circuit is connected to an external connection terminal of the second semiconductor chip.

According to this configuration, a signal line inputted to the fourth demultiplexer circuit can be connected to an external connection terminal of the second semiconductor chip.

In addition, the present invention may have a configuration wherein at least one output signal line from among the plurality of output signal lines outputted from the fourth demultiplexer circuit is connected to one of the plurality of input signal lines inputted to the third multiplexer circuit.

According to this configuration, a signal line inputted to the fourth demultiplexer circuit can be connected to any one of the plurality of input signal lines that is inputted to the third multiplexer circuit.

In addition, the present invention may have a configuration wherein the second semiconductor chip comprises a second operation mode setting circuit, and wherein the fourth demultiplexer circuit is controlled by an operation mode setting signal outputted from the second operation mode setting circuit.

According to this configuration, a signal from one input signal that is inputted to the fourth demultiplexer circuit can be outputted to any one of the plurality of output signal lines that is outputted from the fourth demultiplexer circuit under the control of the operation mode setting signal.

In the below described configuration the signs within parentheses correspond to the signs in FIG. 1.

The second semiconductor device according to one embodiment of the present invention has a chip-on-chip structure wherein; a first semiconductor chip (1), incorporating a first circuit block (3), where first and second inter-chip connection terminals (C1, C2) and first and second external connection terminals (P1, P3) are formed on a surface of the chip; and a second semiconductor chip (2), incorporating a second circuit block (5) provided with input and output terminals for a normal operation mode and input and output terminals for a test mode, so that a signal is transmitted to, and is received from, the first circuit block (3) via input and output terminals for the normal operation mode, where third and fourth inter-chip connection terminals (C3, C4) and third and fourth external connection terminals (P5, P6) are formed on a surface of the chip; are adhered to each other in a form wherein the surfaces of the chips are opposed to each other, and wherein the first and third inter-chip connection terminals are connected to each other, and the second and fourth inter-chip connection terminals are connected to each other; wherein the first semiconductor chip (1) comprises: a first signal channel setting switching circuit (D2, M1) for setting signal channels between an output terminal (Out1) of the first circuit block (3) as well as the first external connection terminal (P1), and the first inter-chip connection terminal (C1); and a second signal channel setting switching circuit (D1, M2) for setting signal channels between the second inter-chip connection terminal (C2) and an input terminal (In2) of the first circuit block as well as the second external connection terminal (P3), wherein a first operation mode setting signal (S1, S2) is inputted to the first and second signal channel setting switching circuits and the first signal channel setting switching circuit (D2, M1) sets a signal channel for connecting the output terminal (Out1) of the first circuit block to the first inter-chip connection terminal (C1) and the second signal channel setting switching circuit (D1, M2) sets a signal channel for connecting the second inter-chip connection terminal (C2) to the input terminal (In2) of the first circuit block when the first operation mode setting signal indicates the normal operation mode, and the first signal channel setting switching circuit sets a signal channel for connecting the first external connection terminal (P1) to the first inter-chip connection terminal (C1) and the second signal channel setting switching circuit sets a signal channel for connecting the second external connection terminal (P3) to the second inter-chip connection terminal (C2) when the first operation mode setting signal (S1, S2) indicates a first test mode of the second circuit block (5), and wherein the second semiconductor chip (2) comprises: a third signal channel setting switching circuit (D3, M4) for setting signal channels between the third inter-chip connection terminal (C3) as well as the third external connection terminal (P5), and the input terminal (In1N) for the normal operation mode as well as the input terminal (In1T) for the test mode of the second circuit block (5); and a fourth signal channel setting switching circuit (D4, M3) for setting signal channels between the output terminal (Out2N) for the normal operation mode as well as the output terminal (Out2T) for the test mode of the second circuit block and the fourth inter-chip connection terminal (C4) as well as the fourth external connection terminal (P6), wherein a second operation mode setting signal (S3, S4) is inputted to the third and fourth signal channel setting switching circuit and the third signal channel setting switching circuit (D3, M4) sets a signal channel for connecting the third inter-chip connection terminal (C3) to the input terminal (In1N) for the normal operation mode of the second circuit block and the fourth signal channel setting switching circuit (D4, M3) sets a signal channel for connecting the output terminal (Out2N) for the normal operation mode of the second circuit block to the fourth inter-chip connection terminal (C4) when the second operation mode setting signal indicates the normal operation mode, the third signal channel setting switching circuit sets a signal channel for connecting the third inter-chip connection terminal (C3) to the input terminal (In1T) for the test mode of the second circuit block and the fourth signal channel setting switching circuit sets a signal channel for connecting the output terminal (Out2T) for the test mode of the second circuit block to the fourth inter-chip connection terminal (C4) when the second operation mode setting signal (S3, S4) indicates the first test mode of the second circuit block (5), and the third signal channel setting switching circuit sets a signal channel for connecting the third external connection terminal (P5) to the input terminal (In1T) for the test mode of the second circuit block and the fourth signal channel setting switching circuit sets a signal channel for connecting the output terminal (Out2T) for the test mode of the second circuit block to the fourth external connection terminal (P6) when the second operation mode setting signal (S3, S4) indicates the second test mode of the second circuit block (5).

According to this configuration the first test mode of the second circuit block is a test mode for testing the second circuit block after the first and second semiconductor chips are adhered and connected to each other while the second test mode of the second circuit block is a test mode for testing the second circuit block before the first and second semiconductor chips are adhered to each other, and a signal is inputted from, and is outputted to, the second circuit block via the third and fourth inter-chip connection terminals in the second semiconductor chip, in both the cases of the normal operation mode and of the first test mode after the adhesion. A signal is inputted to input terminals, and is outputted from output terminals, for the respective mode at the time of the normal operation mode and at the time of the test mode in the second circuit block, wherein the inter-chip connection terminals that become signal channels between the first and second semiconductor chips are commonly used at the time of the normal operation mode and at the time of the first test mode, and therefore a semiconductor device can be implemented wherein the number of inter-chip connection terminals can be reduced, the area of the chips can be reduced and possibility of defects in the connection between the chips can be reduced. In addition, a signal is inputted and outputted via the third and fourth external connection terminals of the second semiconductor chip before the adhesion of the chips in the second test mode, and thereby a test for the second circuit block can be carried out without transmission of the signal through the inter-chip connection terminals. A separate chip can be tested in such a manner before the adhesion of the chips and thereby an increase in the production yield can be achieved.

More preferably, according to one embodiment of the present invention the first semiconductor chip (1) comprises: a fifth external connection terminal (P2) formed on a surface of the chip and connected to the first signal channel setting switching circuit; and a sixth external connection terminal (P4) connected to the second signal channel setting switching circuit, wherein the first signal channel setting switching circuit (D2, M1) sets a signal channel for connecting the output terminal (Out1) of the first circuit block to the fifth external connection terminal (P2) and the second signal channel setting switching circuit (D1, M2) sets a signal channel for connecting the sixth external connection terminal (P4) to the input terminal (In2) of the first circuit block when the first operation mode setting signal (S1, S2) indicates the test mode of the first circuit block (3).

According to this configuration, a signal can be inputted to, and can be outputted from the semiconductor device via the fifth and sixth external connection terminals of the first semiconductor chip before and after the chips are adhered to each other during the test mode of the first circuit block, and thereby the test of the first circuit block can be carried out without allowing a signal to pass through the inter-chip connection terminals. An increase in the production yield can be achieved by testing a chip separately before it is adhered to another chip.

In addition, according to one embodiment of the present invention the first semiconductor chip (1) preferably comprises a first operation mode setting circuit (4) for outputting the first operation mode setting signal to the first and second signal channel setting switching circuits, and wherein the second semiconductor chip (2) comprises a second operation mode setting circuit (6) for outputting the second operation mode setting signal to the third and fourth signal channel setting switching circuits.

According to this configuration, the first operation mode setting circuit controls the first and second signal channel setting switching circuits and the second operation mode setting circuit controls the third and fourth signal channel setting switching circuits.

The third semiconductor device according to one embodiment of the present invention is a semiconductor device having a chip-on-chip structure wherein; a first semiconductor chip (1), incorporating a first circuit block (3), where first and second inter-chip connection terminals (C1, C2) and first and second external connection terminals (P1, P3) are formed on a surface of the chip; and a second semiconductor chip (2), incorporating a second circuit block (5) provided with input and output terminals for a normal operation mode and input and output terminals for a test mode, so that a signal is transmitted to, and is received from, the first circuit block (3) via input and output terminals for the normal operation mode, where third and fourth inter-chip connection terminals (C3, C4) and third and fourth external connection terminals (P5, P6) are formed on a surface of the chip; are adhered to each other in a form wherein the surfaces of the chips are opposed to each other, and wherein the first and third inter-chip connection terminals are connected to each other, and the second and fourth inter-chip connection terminals are connected to each other; wherein the first semiconductor chip (1) comprises: a first multiplexer circuit (M1) to which signals from an output terminal (Out1) of the first circuit block and from the first external connection terminal (P1) are inputted and which selects either one of the signals inputted to the first multiplexer circuit based on a first operation mode setting signal (S1) so that the selected signal is outputted to the first inter-chip connection terminal (C1); and a first demultiplexer circuit (D1) to which a signal from the second inter-chip connection terminal (C2) is inputted, and which selects either the input terminal (In2) of the first circuit block or the second external connection terminal (P3) based on the first operation mode setting signal (S1), and which outputs a signal inputted from the second inter-chip connection terminal to the selected terminal, wherein the first multiplexer circuit (M1) selects a signal from the output terminal (Out1) of the first circuit block and the first demultiplexer circuit (D1) selects an input terminal (In2) of the first circuit block when the first operation mode setting signal (S1) indicates the normal operation mode, and the first multiplexer circuit (M1) selects a signal from the first external connection terminal (P1) and the first demultiplexer circuit (D1) selects the second external connection terminal (P3) when the first operation mode setting signal (S1) indicates a the first test mode of the second circuit block (5), and wherein the second semiconductor chip (2) comprises: a second demultiplexer circuit (D3) to which a signal is inputted from the third inter-chip connection terminal (C3), and which has an output terminal connected to the input terminal (In1N) for the normal operation mode of the second circuit block and an output terminal that is connectable to the input terminal (In1T) for the test mode of the second circuit block and which selects either one of the two output terminals of the second demultiplexer circuit based on a second operation mode setting signal (S3) and which outputs a signal inputted from the third inter-chip connection terminal to the selected output terminal; a second multiplexer circuit (M4) to which signals are inputted from the output terminal of the second demultiplexer circuit (D3) that is connectable to the input terminal (In1T) for the test mode of the second circuit and from the third external connection terminal (P5), and which selects either one of the signals inputted to the second multiplexer circuit based on a third operation mode setting signal (S4) and which outputs the selected signal to the input terminal (In1T) for the test mode of the second circuit block; a third multiplexer circuit (M3), having an input terminal connected to the output terminal (Out2N) for the normal operation mode of the second circuit block and an input terminal that is connectable to the output terminal (Out2T) for the test mode of the second circuit block, which selects either one of the two input terminals of the third multiplexer circuit based on the second operation mode setting signal (S3) and which outputs a signal inputted to the selected input terminal to the fourth inter-chip connection terminal (P6); and a third demultiplexer circuit (D4) to which a signal is inputted from the output terminal (Out2T) for the test mode of the second circuit block, and which selects either the input terminal of the third multiplexer circuit (M3) that is connectable to the output terminal for the test mode of the second circuit block or the fourth external connection terminal (P6) based on the third operation mode setting signal (S4) and which outputs a signal inputted from the output terminal for the test mode of the second circuit block to the selected terminal, wherein the second demultiplexer circuit (D3) selects the output terminal connected to the input terminal (In1N) for the normal operation mode of the second circuit block, and the third multiplexer circuit (M3) selects the input terminal connected to the output terminal (Out2N) for the normal operation mode of the second circuit block, when the second operation mode setting signal (S3) indicates the normal operation mode; the second demultiplexer circuit (D3) selects the output terminal that is connectable to the input terminal (In1T) for the test mode of the second circuit block, and the third multiplexer circuit (M3) selects the input terminal that is connectable to the output terminal (Out2T) for the test mode of the second circuit block, when the second operation mode setting signal (S3) indicates the first test mode of the second circuit block (5), the second multiplexer circuit (M4) selects a signal from an output terminal of the second demultiplexer circuit (D3), and the third demultiplexer circuit (D4) selects an input terminal of the third multiplexer circuit (M3), when the third operation mode setting signal (S4) indicates the first test mode of the second circuit block, and the second multiplexer circuit (M4) selects a signal from the third external connection terminal (P5), and the third demultiplexer circuit (D4) selects the fourth external connection terminal (P6), when the third operation mode setting signal (S4) indicates a second test mode of the second circuit block.

According to this configuration, the same effects as of the second semiconductor device of the present invention can be gained.

Furthermore, according to one embodiment of the present invention the first semiconductor chip (1) comprises: fifth and sixth external connection terminals (P2, P4) formed on a surface of the chip; a fourth demultiplexer circuit (D2), inserted between the output terminal (Out1) of the first circuit block and the first multiplexer circuit (M1), to which an output signal of the first circuit block (3) is inputted and which selects either the first multiplexer circuit (M1) or the fifth external connection terminal (P2) based on a fourth operation mode setting signal (S2) and which outputs an output signal from the first circuit block, that is inputted, to the selected circuit or the selected terminal; and a fourth multiplexer circuit (M2), inserted between the input terminal (In2) of the first circuit block and the first demultiplexer circuit (D1), to which an output signal from the first demultiplexer circuit (D1) and a signal from the sixth external connection terminal (P4) are inputted, and which selects either of the signals inputted to the fourth multiplexer circuit based on the fourth operation mode setting signal (S2) and which outputs the selected signal to the first circuit block, wherein the fourth demultiplexer circuit (D2) selects the first multiplexer circuit (M1), and fourth multiplexer circuit (M2) selects an output signal from the first demultiplexer circuit (D1), when the fourth operation mode setting signal (S2) indicates the normal operation mode, and the fourth demultiplexer circuit (D2) selects the fifth external connection terminal (P2), and the fourth multiplexer circuit (M2) selects a signal from the sixth external connection terminal (P4), when the fourth operation mode setting signal (S2) indicates the test mode of the first circuit block (3).

According to this configuration, a signal can be inputted to, and can be outputted from the semiconductor device via the fifth and sixth external connection terminals of the first semiconductor chip before and after the chips.are adhered to each other during the test mode of the first circuit block, and thereby the test of the first circuit block can be carried out without allowing a signal to pass through the inter-chip connection terminals. An increase in the production yield can be achieved by testing a chip separately before it is adhered to another chip.

In addition, according to one embodiment of the present invention the first semiconductor chip (1) preferably comprises a first operation mode setting circuit (4) for outputting the first operation mode setting signal (S1) to the first multiplexer circuit and to the first demultiplexer circuit; and the second semiconductor chip (2) comprises a second operation mode setting circuit (6) for outputting the second operation mode setting signal (S3) to the second demultiplexer circuit and to the third multiplexer circuit and for outputting the third operation mode setting signal (S4) to the second multiplexer circuit and to the third demultiplexer circuit.

According to this configuration the first operation mode setting circuit can control the first multiplexer circuit, and the first demultiplexer circuit, while the second operation mode setting circuit can control the second demultiplexer circuit, the third multiplexer circuit, the second multiplexer circuit and the third demultiplexer circuit.

In addition, according to one embodiment of the present invention the first semiconductor chip (1) preferably comprises a first operation mode setting circuit (4) for outputting the first operation mode setting signal (S1) to the first multiplexer circuit and to the first demultiplexer circuit and for outputting the fourth operation mode setting signal (S2) to the fourth demultiplexer circuit and to the fourth multiplexer circuit; and the second semiconductor chip (2) comprises a second operation mode setting circuit (6) for outputting the second operation mode setting signal (S3) to the second demultiplexer circuit and to the third multiplexer circuit and for outputting the third operation mode setting signal (S4) to the second multiplexer circuit and to the third demultiplexer circuit.

According to this configuration the first operation mode setting circuit can control the first multiplexer circuit, the first demultiplexer circuit, the fourth demultiplexer circuit and the fourth multiplexer circuit, while the second operation mode setting circuit can control the second demultiplexer circuit, the third multiplexer circuit, the second multiplexer circuit and the third demultiplexer circuit.

As described above, a high performance semiconductor device having a COC structure and having chips with small surface areas can be implemented according to the present invention by using semiconductor chips, wherein the number of inter-chip connection terminals is reduced, and the areas of the chips are reduced.

DESCRIPTION OF THE PREFERRED EMBODIMENTS

The embodiments of the present invention are described below in reference to the drawings.

Figure 1A:
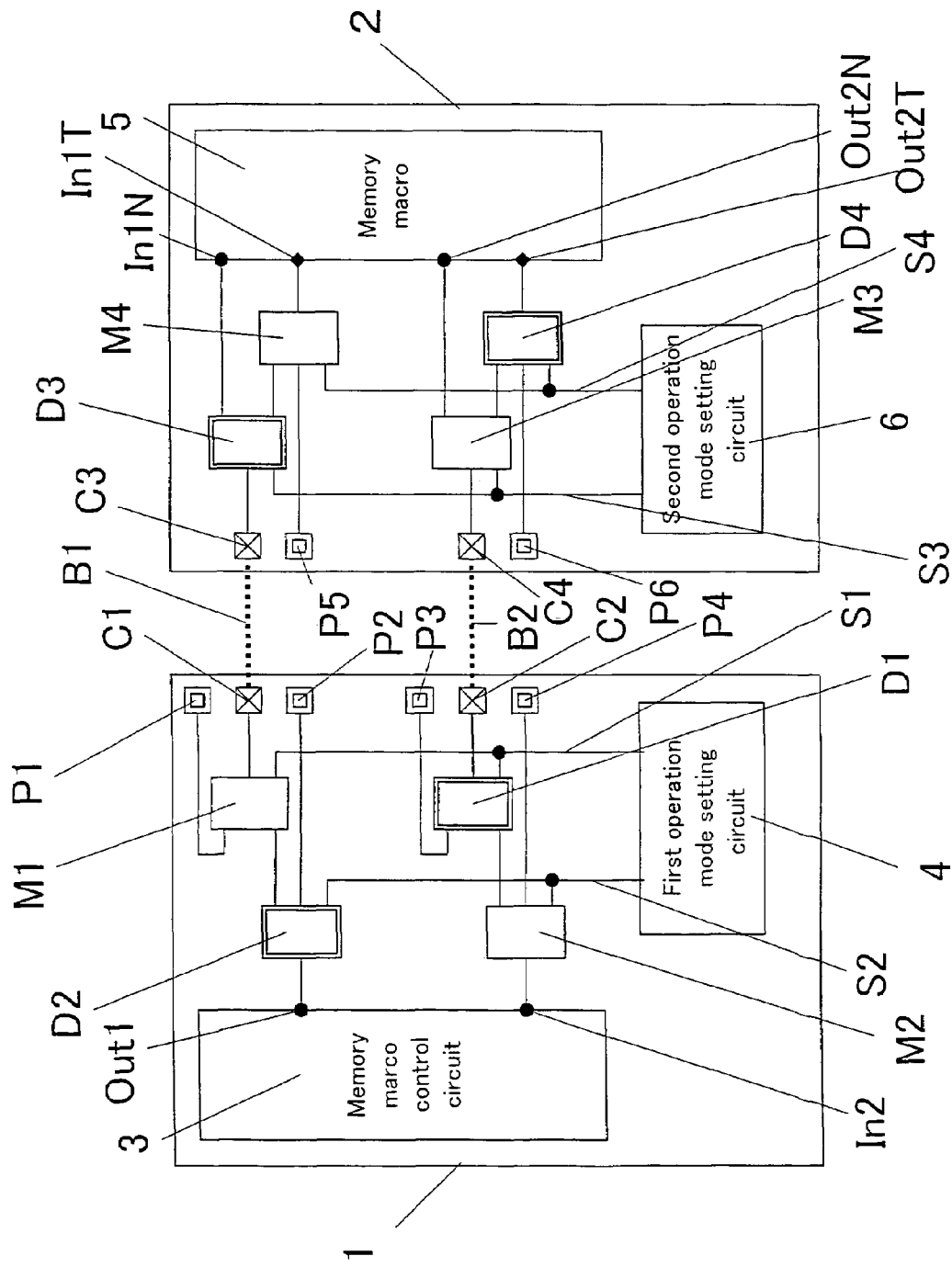
FIG. 1A is a configuration diagram of a signal line connection between a first semiconductor clip and a second semiconductor chip in the semiconductor device according to an embodiment of the present invention.
Figure 1B:
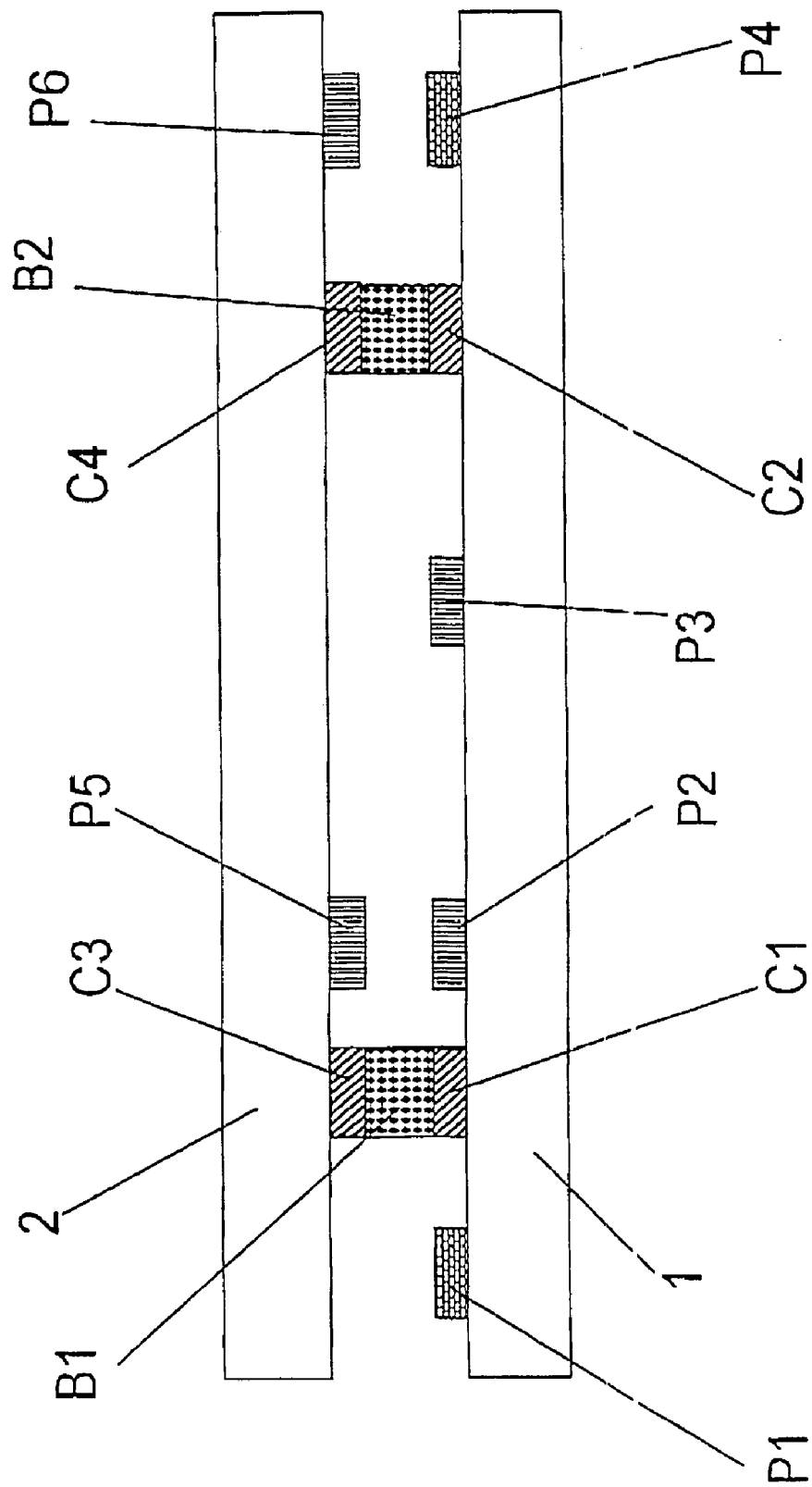
FIG. 1B illustrates the first semiconductor chip and the second semiconductor chip bonded together such that the chip surfaces face each other.

FIG. 1A is a configuration diagram of a signal line connection between a first semiconductor chip and a second semiconductor chip in a semiconductor device according to an embodiment of the present invention. FIG. 1B illustrates the first semiconductor chip and the second semiconductor chip bonded together such that the chip surfaces face each other. In FIGS. 1A and 1B, 1 indicates the first semiconductor chip, 2 indicates the second semiconductor chip, 3 indicates a memory macro control circuit formed on first semiconductor chip 1, 4 indicates a first operation mode setting circuit formed on first semiconductor chip 1, 5 indicates a memory macro formed on second semiconductor chip 2, 6 indicates a second operation mode setting circuit formed on second semiconductor chip 2, M1 indicates a first multiplexer circuit, M2 indicates a second multiplexer circuit, M3 indicates a third multiplexer circuit, M2 indicates a fourth multiplexer circuit, D1 indicates a first demultiplexer circuit, D2 indicates a second demultiplexer circuit, D3 indicates a third demultiplexer circuit, D4 indicates a fourth demultiplexer circuit, P1 indicates an external connection terminal connected to an input signal line of first multiplexer circuit M1, P2 indicates an external connection terminal connected to an output signal line of second demultiplexer circuit D2, P3 indicates an external connection terminal connected to an output signal line of first demultiplexer circuit D1, P4 indicates an external connection terminal connected to an input signal line of second demultiplexer circuit M2, P5 indicates an external connection terminal connected to an input signal line of fourth multiplexer circuit M4, P6 indicates an external connection terminal connected to an output signal line of fourth demultiplexer circuit D4, C indicates an inter-chip connection terminal connected to an output signal line of first multiplexer circuit M1, C2 indicates an interchip connection terminal connected to an input signal line of first demultiplexer circuit D1, C3 indicates an interchip connection terminal connected to an input signal line of third demultiplexer circuit D3, C4 indicates an inter-chip connection terminal connected to an output signal line of third multiplexer circuit M3, S1 indicates a first operation mode setting signal generated by first operation mode setting circuit 4, S2 indicates a second operation mode setting signal generated by first operation mode setting circuit 4, S3 indicates a third operation mode setting signal generated by second operation mode setting circuit 6, 54 indicates a fourth operation mode setting signal generated by second operation mode setting circuit 6, Outi indicates an output terminal of memory macro control circuit 3, In1N indicates an input terminal ohf memory macro control circuit 3, In1N indicates an input terminal at the time of the normal operation mode of memory macro 5, In1T indicates an input terminal at the time of the test mode of memory macro 5, Out2N indicates an output terminal at the time of the normal operation mode of memory macro 5, and Out2T indicates an output terminal at the time of the test mode of memory macro 5.

In addition, dotted lines denoted as B1 and B2 indicate correspondence of inter-chip connection terminals that are connected to each other at the time when first semiconductor chip 1 and second semiconductor chip 2 are adhered and connected to each other, wherein B1 indicates that inter-chip connection terminal C1 and inter-chip connection terminal C3 are connected to each other, and B2 indicates that inter-chip connection terminal C2 and inter-chip connection terminal C4 are connected to each other.

Second demultiplexer circuit D2 outputs a signal that has been inputted from output terminal Out1 of memory macro control circuit 3 to first multiplexer circuit M1 when second operation mode setting signal S2 is of logic "H" (high) and outputs the signal to external connection terminal P2 when second operation mode setting signal S2 is of logic "L" (low).

A signal from external connection terminal P1 and a signal from second demultiplexer circuit D2 are inputted to first multiplexer circuit M1, which selects the signal from second demultiplexer circuit D2 when first operation mode setting signal S1 is of logic "H", and selects the signal from external connection terminal P1 when first operation mode setting signal S1 is of logic "L", so that the selected signal is outputted to inter-chip connection terminal C1.

First demultiplexer circuit D1 outputs a signal that has been inputted from inter-chip connection terminal C2 to second multiplexer circuit M2 when first operation mode setting signal S1 is of logic "H", and outputs the signal to external connection terminal P3 when first operation mode setting signal S1 is of logic "L."

A signal from external connection terminal P4 and a signal from first demultiplexer circuit D1 are inputted to second multiplexer circuit M2, which selects the signal from first demultiplexer circuit D1 when second operation mode setting signal S2 is of logic "H", and selects the signal from external connection terminal P4 when second operation mode setting signal S2 is of logic "L" so that the selected signal is outputted to input terminal In2 of memory macro control circuit 3.

In addition, third demultiplexer circuit D3 outputs a signal that has been inputted from inter-chip connection terminal C3 to input terminal In1N at the time of the normal operation mode of memory macro 5 when third operation mode setting signal S3 is of logic "H" and outputs the signal to fourth multiplexer circuit M4 when third operation mode setting signal S3 is of logic "L."

A signal from external connection terminal P5 and a signal from third demultiplexer circuit D3 are inputted to fourth multiplexer circuit M4, which selects the signal from third demultiplexer circuit D3 when fourth operation mode setting signal S4 is of logic "H" and selects the signal from external connection terminal PS when fourth operation mode setting signal S4 is of logic "L" so that the selected signal is outputted to input terminal In1T at the time of the test mode of memory macro 5.

Fourth demultiplexer circuit D4 outputs a signal that has been inputted from output terminal Out2T at the time of the test mode of memory macro 5 to third multiplexer circuit M3 when fourth operation mode setting signal S4 is of logic "H" and outputs the signal to external connection terminal P6 when fourth operation mode setting signal S4 is of logic "L."

A signal from output terminal Out2N at the time of the normal operation mode of memory macro 5 and a signal from fourth demultiplexer circuit D4 are inputted to third multiplexer circuit M3, which selects the signal from output terminal Out2N of memory macro 5 when third operation mode setting signal S3 is of logic "H" and selects the signal from fourth demultiplexer circuit D4 when third operation mode setting signal S3 is of logic "L" so that the selected signal is outputted to inter-chip connection terminal C4.

Table 1 is an operation mode setting signal logic table in the semiconductor device of the embodiment of the present invention. The logic of two operation mode setting signals S1 and S2 generated by first operation mode setting circuit 4 and the logic of two operation mode setting signals S3 and S4 generated by second operation mode setting circuit 6 are shown for each operation mode.

TABLE 1

| | Operation Mode | S1 | S2 | S3 | S4 |
|---|---|---|---|---|---|
| Before Connection of Chips | Memory Macro Test Mode | Don't Care | Don't Care | Don't Care | L |
| | Memory Macro Control Circuit Test Mode | Don't Care | L | Don't Care | Don't Care |
| After Connection of Chips | Memory Macro Test Mode | L | Don't Care | L | H |
| | Memory Macro Control Circuit Test Mode | Don't Care | L | Don't Care | Don't Care |
| | Normal Operation Mode | H | H | H | Don't Care |

"Don't care" in Table 1 indicates that the operation mode setting signal in the corresponding column does not relate to the setting of the mode in that column.

Next, the operation of the semiconductor device of the embodiment of the present invention is described.

Figure 2:
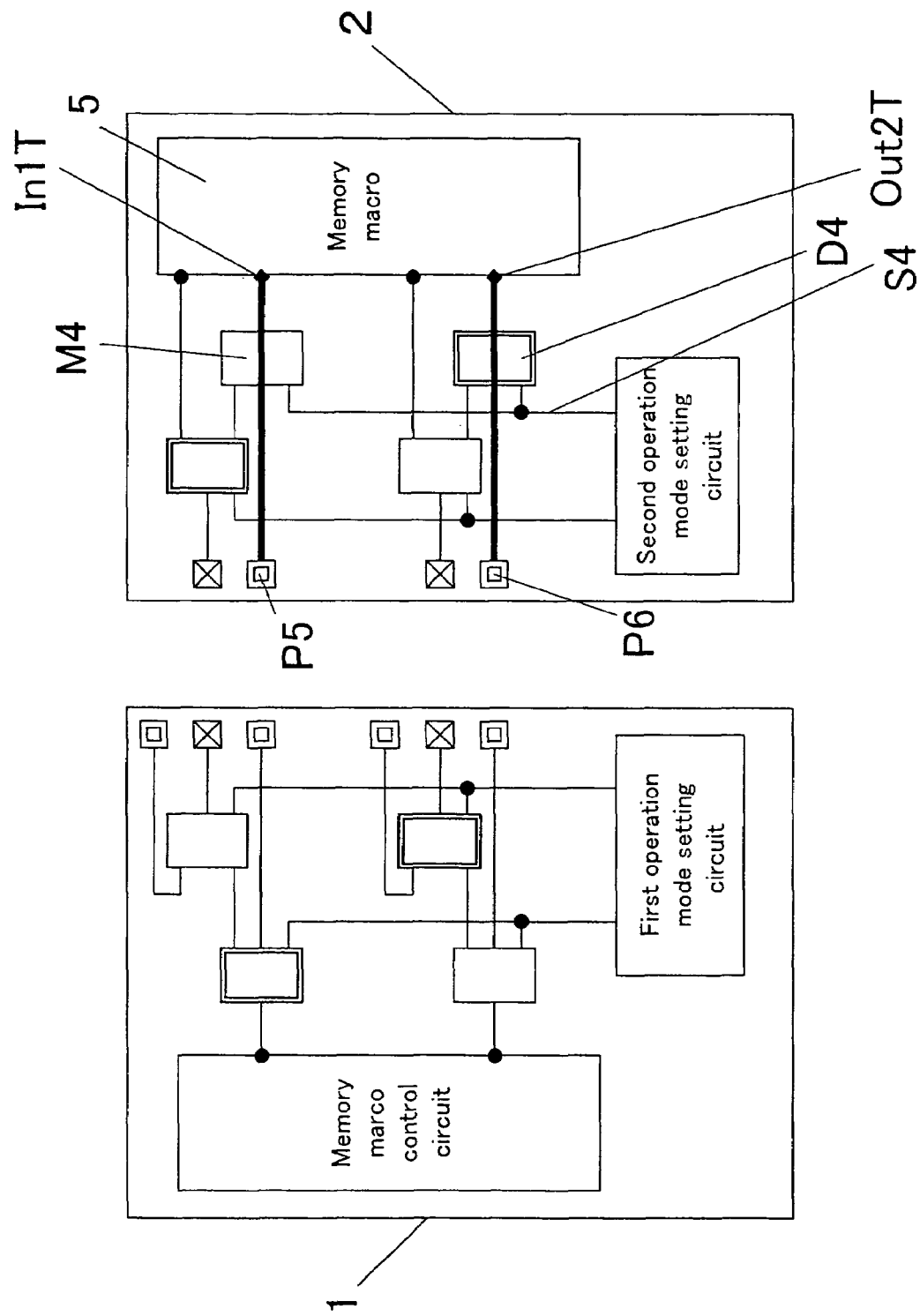
FIG. 2 is a diagram showing a signal transmission system at the time of the test mode for the memory macro before the connection of the chips in the semiconductor device according to the embodiment of the present invention.

FIG. 2 is a diagram showing a signal transmission system at the time of the test mode of the memory macro before the connection of the chips. In this case, as shown in Table 1, the logic of operation mode setting signal S4 is set at "L." An input signal that has been connected to external connection terminal P5 is connected to fourth multiplexer circuit M4, is selected by logic "L" of operation mode setting signal S4, is outputted to an output signal line of fourth multiplexer circuit M4 and is connected to input terminal In1T at the time of the test mode of memory macro 5. At the same time, output terminal Out2T at the time of the test mode of memory macro 5 is connected to fourth demultiplexer circuit D4 and is connected to external connection terminal P6 by means of logic "L" of operation mode setting signal S4.

In this configuration memory macro 5 can be tested without passage of a signal through inter-chip connection terminals C3 and C4 before the connection of the chips. In the case wherein the test result at this time shows a defect, it is clear that this defect is not caused by inter-chip connection terminals C3 and C4.

Figure 3:
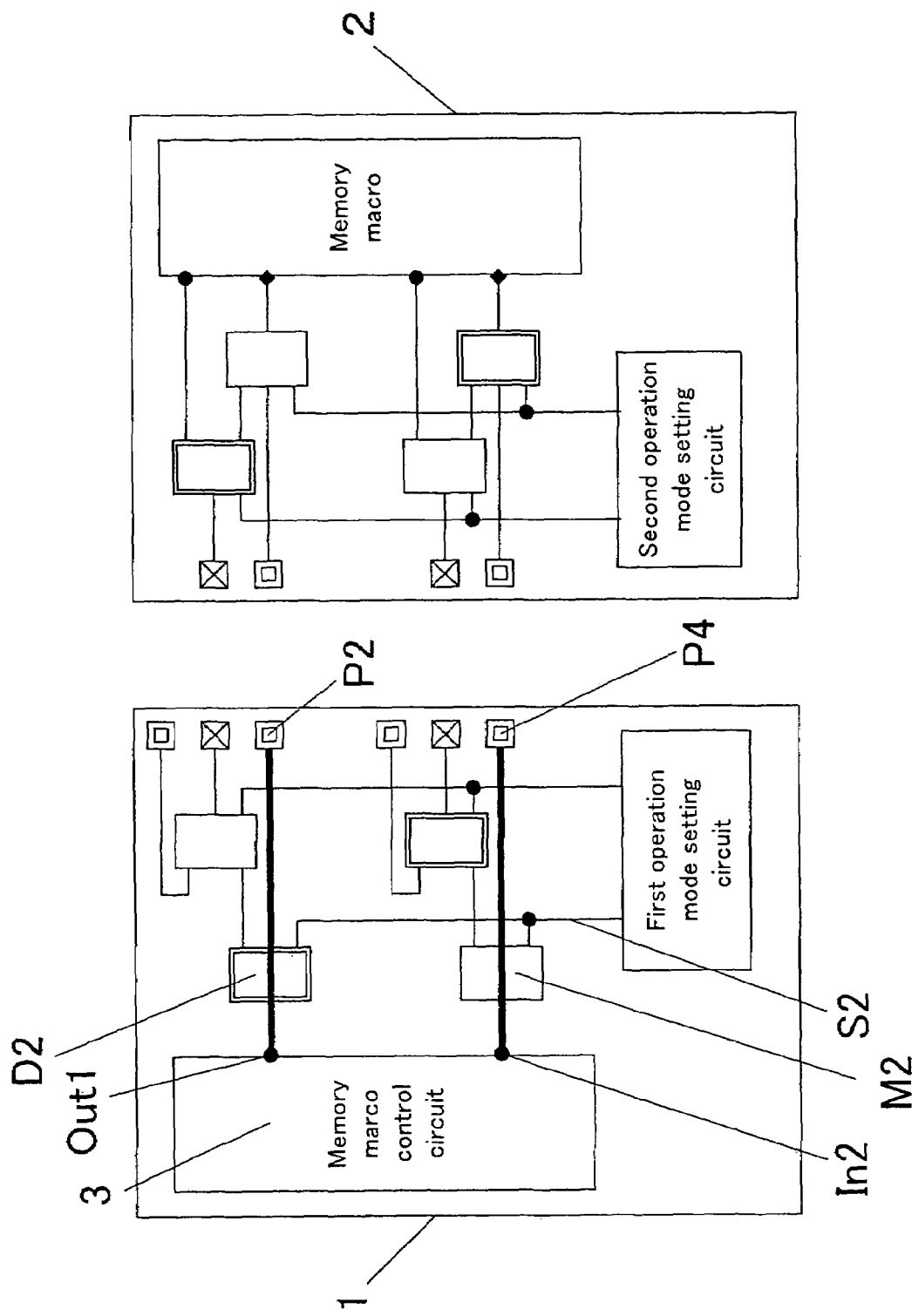
FIG. 3 is a diagram showing a signal transmission system at the time of the test mode for the memory macro control circuit before and after the connection of the chips in the semiconductor device according to the embodiment of the present invention.

FIG. 3 is a diagram showing a signal transmission system at the time of the test mode of the memory macro control circuit before and after the connection of the chips. In this case, as shown in Table 1, the logic of operation mode setting signal S2 is set at "L" both before and after the connection of the chips. The input signal that has been connected to external connection terminal P4 is connected to second multiplexer circuit M2, is selected by logic "L" of operation mode setting signal S2, is outputted to an output signal line of second multiplexer circuit M2, and is connected to input terminal In2 of memory macro control circuit 3. At the same time, output terminal Out1 of memory macro control circuit 3 is connected to second demultiplexer circuit D2 and is connected to external connection terminal P2 by means of logic "L" of operation mode setting signal S2.

This configuration allows for the testing of memory macro control circuit 3 without passage of a signal through inter-chip connection terminals C1 and C2 before and after the connection of the chips. In the case wherein the test result at this time shows a defect, it is clear that this defect is not caused by inter-chip connection terminals C1 and C2.

Figure 4:
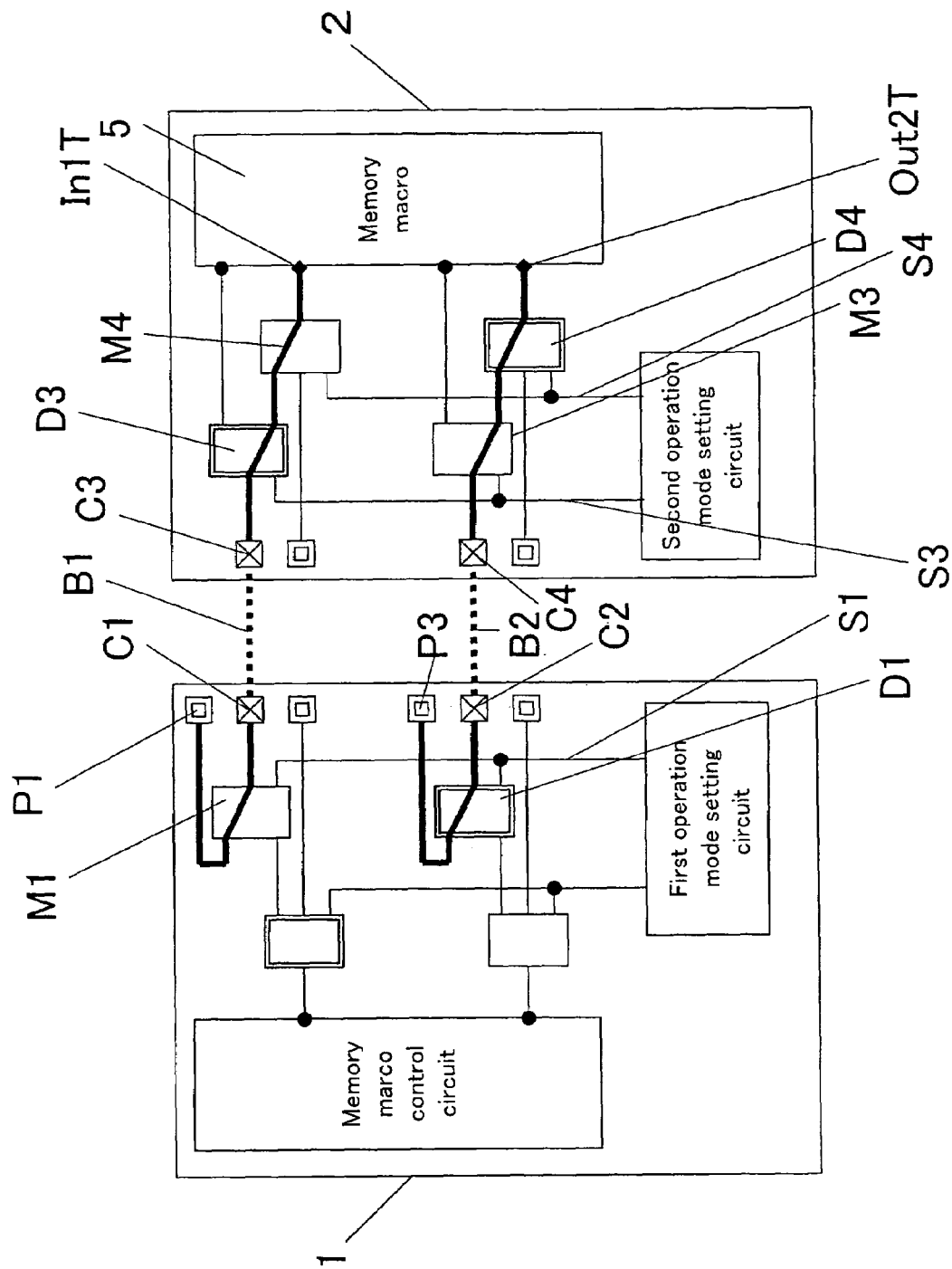
FIG. 4 is a diagram showing a signal transmission system at the time of the test mode for the memory macro after the connection of the chips in the semiconductor device according to the embodiment of the present invention.

FIG. 4 is a diagram showing a signal transmission system at the time of the test mode of the memory macro after the connection of the chips. In this case, as shown in Table 1, the logic of operation mode setting signals S1 and S3 is set at "L" and the logic of operation mode setting signal S4 is set at "H." The input signal that has been connected to external connection terminal P1 is connected to first multiplexer circuit M1, is selected by logic "L" of operation mode setting signal S1, and is connected to inter-chip connection terminal C1. Furthermore, the input signal is transmitted to inter-chip connection terminal C3 by means of connection (B1) between inter-chip connection terminals C1 and C3, is inputted to third demultiplexer circuit D3, is inputted to fourth multiplexer circuit M4 by means of logic "L" of operation mode setting signal S3, is selected by logic "H" of operation mode setting signal S4 and is connected to input terminal In1T at the time of the test mode of memory macro 5. At the same time, output terminal Out2T at the time of the test mode of memory macro 5, is connected to fourth demultiplexer circuit D4, is inputted to third multiplexer circuit M3 by means of logic "H" of operation mode setting signal S4, is selected by logic "L" of operation mode setting signal S3 and is connected to inter-chip connection terminal C4. Furthermore, a signal is transmitted to inter-chip connection terminal C2 by means of connection (B2) between inter-chip connection terminals C2 and C4, is inputted to first demultiplexer circuit D1 and is connected to external connection terminal P3 that is selected by logic "L" of operation mode setting signal S1.

This configuration allows for testing of memory macro 5 after the connection of the chips.

In general, two chips connected by a COC connection have a relationship wherein one chip has a great area and the other chip has a small area, and the chip having the great area becomes connectable to an external connection terminal after the connection of the chips. In the case of the present embodiment it is assumed that first semiconductor chip 1 on which memory macro control circuit 3 is mounted has a great area, and second semiconductor chip 2 on which memory macro 5 is mounted has a small area, and therefore, only first semiconductor chip 1 having a great area can be directly controlled from the outside after the connection of the chips, while it is necessary to use first semiconductor chip 1 and inter-chip connection terminals C1 to C4 in order to control second semiconductor chip 2, on which memory macro 5 is mounted, from the outside. Accordingly, the signal path at the time of testing of memory macro 5 after the connection of the chips cannot utilize external connection terminals P5 and P6 of second semiconductor chip 2, and thereby becomes the signal path as shown in FIG. 4.

Figure 5:
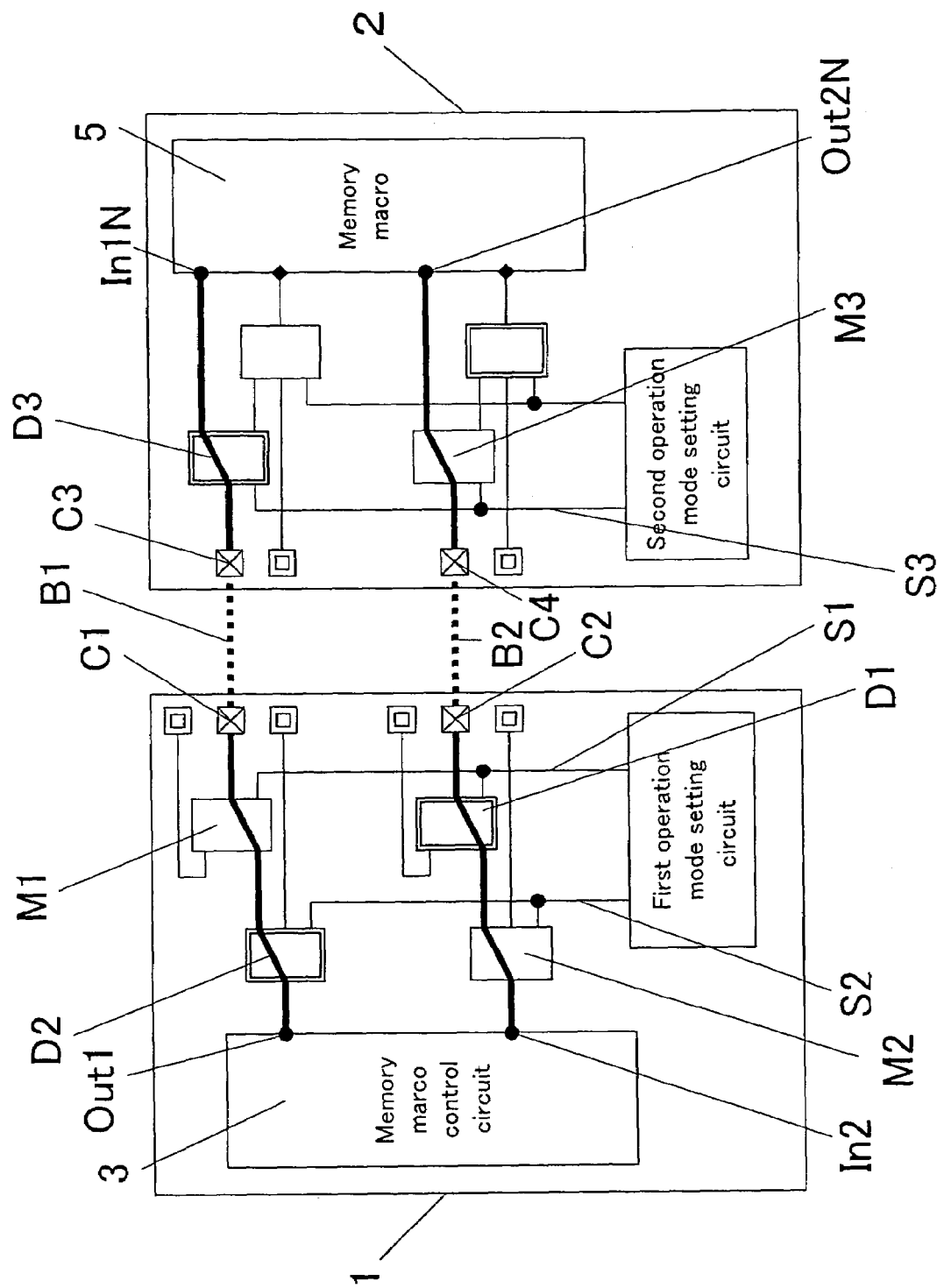
FIG. 5 is a diagram showing a signal transmission system at the time of the normal operation mode after the connection of the chips in the semiconductor device according to the embodiment of the present invention.
Figure 6:
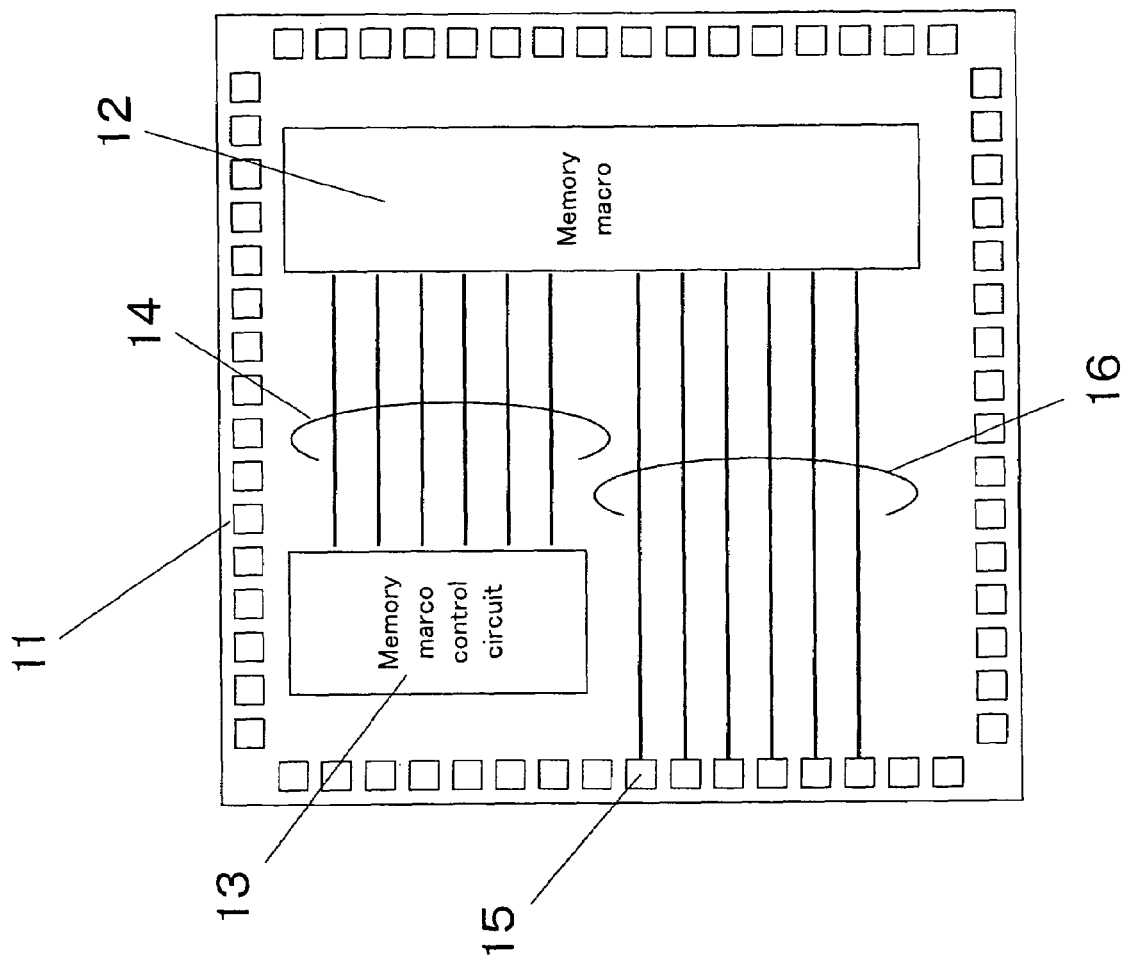
FIG. 6 is a chip configuration diagram showing an example of a semiconductor device according to the prior art.

FIG. 5 is a diagram showing a signal transmission system at the time of the normal operation mode after the connection of the chip. In this case, as shown in Table 1, the logic of operation mode setting signals S1, S2 and S3 is set at "H." Output terminal Out1 of memory macro control circuit 3 is connected to second demultiplexer circuit D2, is connected to first multiplexer circuit M1 by means of logic "H" of operation mode setting signal S2, is selected by logic "H" of operation mode setting signal S1 and is connected to inter-chip connection terminal C1. Furthermore, the signal is transmitted to inter-chip connection terminal C3 by means of connection (B1) between inter-chip connection terminals C1 and C3, is inputted to third demultiplexer circuit D3 and is connected to input terminal In1N at the time of the normal operation mode of memory macro 5 by means of logic "H" of operation mode setting signal S3. At the same time, output terminal Out2N at the time of the normal operation mode of memory macro 5 is inputted to third multiplexer circuit M3, is selected by logic "H" of operation mode setting signal S3 and is connected to inter-chip connection terminal C4. Furthermore, the signal is transmitted to inter-chip connection terminal C2 by means of connection (B2) between inter-chip connection terminals C2 and C4, is inputted to first demultiplexer circuit D1, is inputted to second multiplexer circuit M2, by means of logic "H" of operation mode setting signal S1, is selected by logic "H" of operation mode setting signal S2 and is connected to input terminal In2 of memory macro control circuit 3.

This configuration allows for a signal transmission between memory macro control circuit 3 and memory macro 5 without passage of the signal through external connection terminals P1 to P6 at the time of the normal operation mode after the connection of the chips.

As described above, according to the embodiment of the present invention a signal is inputted to, and is outputted from, memory macro 5 via inter-chip connection terminals C3 and C4 in second semiconductor chip 2, in either the case of the normal operation mode or the test mode of the memory macro after the connection of the chips. Though a signal is inputted to an input terminal and is outputted from an output terminal for the normal operation mode and for the test mode in memory macro 5 in each mode, the inter-chip connection terminals, which become a signal path, between the first and second semiconductor chips 1 and 2 are used both in the normal operation mode and in the test mode of the memory macro, and therefore a semiconductor device can be implemented wherein the number of inter-chip connection terminals is reduced, the area of the chip is reduced and possibility of defects in the connection between the chips is reduced, so that an increase in the yield can be achieved.

In addition, testing of memory macro 5 can be carried out without passage of a signal through the inter-chip connection terminals in the test mode of the memory macro before the connection of the chips. Moreover, testing of memory macro control circuit 3 can be carried out without passage of a signal through the inter-chip connection terminals in the test mode of the memory macro control circuit before the connection of the chips. As described above, a semiconductor device having a COC structure wherein an increase in the production yield, which was formerly difficult to achieve in a semiconductor device having a system-on-chip structure can be achieved by testing a single chip before the connection of the chips.

What is claimed is:

1. A semiconductor device having a chip-on-chip structure wherein a first semiconductor chip having a circuit block where a plurality of inter-chip connection terminals and a plurality of external connection terminals are formed on a surface of the chip and a second semiconductor chip having a circuit block where a plurality of inter-chip connection terminals and a plurality of external connection terminals are formed on a surface of the chip are adhered to each other in a form wherein the surfaces of the chips are opposed to each other so that the inter-chip connection terminals of said first semiconductor chip and the inter-chip connection terminals of said second semiconductor chip are connected to each other, wherein
said first semiconductor chip comprises a first multiplexer circuit for selecting an input signal line from among a plurality of input signal lines so as to output a signal from the selected input signal line to an output signal line, and the output signal line of said first multiplexer circuit is connected to an inter-chip connection terminal of said first semiconductor chip.

2. The semiconductor device according to claim 1, wherein at least one input signal line from among the plurality of input signal lines inputted to said first multiplexer circuit is connected to an external connection terminal of said first semiconductor chip.

3. The semiconductor device according to claim 2, wherein said first semiconductor chip comprises a first operation mode setting circuit and wherein said first multiplexer circuit is controlled by an operation mode setting signal outputted from said first operation mode setting circuit.

4. The semiconductor device according to claim 1, wherein said first semiconductor chip comprises a first demultiplexer circuit for selecting any one of a plurality of output signal lines, and for outputting a signal from an input signal line to the selected output signal line, and wherein the input signal line inputted to said first demultiplexer circuit is connected to an inter-chip connection terminal of said first semiconductor chip.

5. The semiconductor device according to claim 4, wherein at least one output signal line from among the plurality of output signal lines outputted from said first demultiplexer circuit is connected to an external connection terminal of said first semiconductor chip.

6. The semiconductor device according to claim 5, wherein said first semiconductor chip comprises a first operation mode setting circuit and wherein said first demultiplexer circuit is controlled by an operation mode setting signal outputted from said first operation mode setting circuit.

7. The semiconductor device according to claim 1, wherein said first semiconductor chip comprises a second demultiplexer circuit for selecting any one of a plurality of output signal lines, and for outputting a signal from an input signal line to the selected output signal line, and wherein at least one output signal line from among the plurality of output signal lines outputted from said second demultiplexer circuit is connected to an external connection terminal of said first semiconductor chip.

8. The semiconductor device according to claim 7, wherein at least one output signal line from among the plurality of output signal lines outputted from said second demultiplexer circuit is connected to one of the plurality of input signal lines inputted to said first multiplexer circuit.

9. The semiconductor device according to claim 8, wherein said first semiconductor chip comprises a first operation mode setting circuit, and wherein said second demultiplexer circuit is controlled by an operation mode setting signal outputted from said first operation mode setting circuit.

10. The semiconductor device according to claim 4, wherein said first semiconductor chip comprises a second multiplexer circuit for selecting an input signal line from among a plurality of input signal lines and for outputting a signal from the selected input signal line to an output signal line, and wherein at least one input signal line from among the plurality of input signal lines inputted to said second multiplexer circuit is connected to an external connection terminal of said first semiconductor chip.

11. The semiconductor device according to claim 10, wherein at least one input signal line from among the plurality of input signal lines inputted to said second multiplexer circuit is connected to one of the plurality of output signal lines outputted from said first demultiplexer circuit.

12. The semiconductor device according to claim 11, wherein said first semiconductor chip comprises a first operation mode setting circuit, and wherein said second multiplexer circuit is controlled by an operation mode setting signal outputted from said first operation mode setting circuit.

13. The semiconductor device according to claim 1, wherein said second semiconductor chip comprises a third demultiplexer circuit for selecting any one of a plurality of output signal lines, and for outputting a signal from an input signal line to the selected output signal line, and wherein the input signal line inputted to said third demultiplexer circuit is connected to an inter-chip connection terminal of said second semiconductor chip.

14. The semiconductor device according to claim 13, wherein said second semiconductor chip comprises a second operation mode setting circuit, and wherein said third demultiplexer circuit is controlled by an operation mode setting signal outputted from said second operation mode setting circuit.

15. The semiconductor device according to claim 13, wherein said second semiconductor chip comprises a third multiplexer circuit for selecting an input signal line from among a plurality of input signal lines and for outputting a signal from the selected input signal line to an output signal line, and wherein the output signal line of said third multiplexer circuit is connected to an inter-chip connection terminal of said second semiconductor chip.

16. The semiconductor device according to claim 15, wherein said second semiconductor chip comprises a second operation mode setting circuit, and wherein said third multiplexer circuit is controlled by an operation mode setting signal outputted from said second operation mode setting circuit.

17. The semiconductor device according to claim 13, wherein said second semiconductor chip comprises a fourth multiplexer circuit for selecting an input signal line from among a plurality of input signal lines and for outputting a signal from the selected input signal line to an output signal line, and wherein at least one input signal line from among the plurality of input signal lines inputted to said fourth multiplexer circuit is connected to an external connection terminal of said second semiconductor chip.

18. The semiconductor device according to claim 17, wherein at least one input signal line from among the plurality of input signal lines inputted to said fourth multiplexer circuit is connected to one of the plurality of output signals outputted from said third demultiplexer circuit.

19. The semiconductor device according to claim 18, wherein said second semiconductor chip comprises a second operation mode setting circuit, and wherein said fourth multiplexer circuit is controlled by an operation mode setting signal outputted from said second operation mode setting circuit.

20. The semiconductor device according to claim 15, wherein said second semiconductor chip comprises a fourth demultiplexer circuit for selecting any one of a plurality of output signal lines, and for outputting a signal from an input signal line to the selected output signal line, and wherein at least one output signal line from among the plurality of output signal lines outputted from said fourth demultiplexer circuit is connected to an external connection terminal of said second semiconductor chip.

21. The semiconductor device according to claim 20, wherein at least one output signal line from among the plurality of output signal lines outputted from said fourth demultiplexer circuit is connected to one of the plurality of input signal lines inputted to said third multiplexer circuit.

22. The semiconductor device according to claim 21, wherein said second semiconductor chip comprises a second operation mode setting circuit, and wherein said fourth demultiplexer circuit is controlled by an operation mode setting signal outputted from said second operation mode setting circuit.

23. A semiconductor device having a chip-on-chip structure wherein; a first semiconductor chip, incorporating a first circuit block, where first and second inter-chip connection terminals and first and second external connection terminals are formed on a surface of the chip; and a second semiconductor chip, incorporating a second circuit block provided with input and output terminals for a normal operation mode and input and output terminals for a test mode, so that a signal is transmitted to, and is received from, said first circuit block via input and output terminals for said normal operation mode, where third and fourth inter-chip connection terminals and third and fourth external connection terminals are formed on a surface of the chip; are adhered to each other in a form wherein the surfaces of the chips are opposed to each other, and wherein said first and third inter-chip connection terminals are connected to each other, and said second and fourth inter-chip connection terminals are connected to each other; wherein said first semiconductor chip comprises:
a first signal channel setting switching circuit for setting signal channels between an output terminal of said first circuit block as well as said first external connection terminal, and said first inter-chip connection terminal; and
a second signal channel setting switching circuit for setting signal channels between said second inter-chip connection terminal and an input terminal of said first circuit block as well as said second external connection terminal, wherein
a first operation mode setting signal is inputted to said first and second signal channel setting switching circuits and said first signal channel setting switching circuit sets a signal channel for connecting the output terminal of said first circuit block to said first inter-chip connection terminal and said second signal channel setting switching circuit sets a signal channel for connecting said second inter-chip connection terminal to the input terminal of said first circuit block when said first operation mode setting signal indicates the normal operation mode, and
said first signal channel setting switching circuit sets a signal channel for connecting said first external connection terminal to said first inter-chip connection terminal and said second signal channel setting switching circuit sets a signal channel for connecting said second external connection terminal to said second inter-chip connection terminal when said first operation mode setting signal indicates a first test mode of said second circuit block, and wherein
said second semiconductor chip comprises:
a third signal channel setting switching circuit for setting signal channels between said third inter-chip connection terminal as well as said third external connection terminal, and the input terminal for the normal operation mode as well as the input terminal for the test mode of said second circuit block; and
a fourth signal channel setting switching circuit for setting signal channels between the output terminal for the normal operation mode as well as the output terminal for the test mode of said second circuit block and said fourth inter-chip connection terminal as well as said fourth external connection terminal, wherein
a second operation mode setting signal is inputted to said third and fourth signal channel setting switching circuit and said third signal channel setting switching circuit sets a signal channel for connecting said third inter-chip connection terminal to the input terminal for the normal operation mode of said second circuit block and said fourth signal channel setting switching circuit sets a signal channel for connecting the output terminal for the normal operation mode of said second circuit block to said fourth inter-chip connection terminal when said second operation mode setting signal indicates the normal operation mode, said third signal channel setting switching circuit sets a signal channel for connecting said third inter-chip connection terminal to the input terminal for the test mode of said second circuit block and said fourth signal channel setting switching circuit sets a signal channel for connecting the output terminal for the test mode of said second circuit block to said fourth inter-chip connection terminal when said second operation mode setting signal indicates said first test mode of said second circuit block, and said third signal channel setting switching circuit sets a signal channel for connecting said third external connection terminal to the input terminal for the test mode of said second circuit block and said fourth signal channel setting switching circuit sets a signal channel for connecting the output terminal for the test mode of said second circuit block to said fourth external connection terminal when said second operation mode setting signal indicates the second test mode of said second circuit block.

24. The semiconductor device according to claim 23, wherein said first semiconductor chip comprises:
a fifth external connection terminal connected to said first signal channel setting switching circuit; and a sixth external connection terminal connected to said second signal channel setting switching circuit, wherein
said first signal channel setting switching circuit sets a signal channel for connecting the output terminal of said first circuit block to said fifth external connection terminal and said second signal channel setting switching circuit sets a signal channel for connecting said sixth external connection terminal to the input terminal of said first circuit block when said first operation mode setting signal indicates the test mode of said first circuit block.

25. The semiconductor device according to claim 23, wherein said first semiconductor chip comprises a first operation mode setting circuit for outputting said first operation mode setting signal to said first and second signal channel setting switching circuits, and wherein said second semiconductor chip comprises a second operation mode setting circuit for outputting said second operation mode setting signal to said third and fourth signal channel setting switching circuits.

26. The semiconductor device according to claim 24, wherein said first semiconductor chip comprises a first operation mode setting circuit for outputting said first operation mode setting signal to said first and second signal channel setting switching circuits, and wherein said second semiconductor chip comprises a second operation mode setting circuit for outputting said second operation mode setting signal to said third and fourth signal channel setting switching circuits.

27. A semiconductor device having a chip-on-chip structure wherein; a first semiconductor chip, incorporating a first circuit block, where first and second inter-chip connection terminals and first and second external connection terminals are formed on a surface of the chip; and a second semiconductor chip, incorporating a second circuit block provided with input and output terminals for a normal operation mode and input and output terminals for a test mode, so that a signal is transmitted to, and is received from, said first circuit block via input and output terminals for said normal operation mode, where third and fourth inter-chip connection terminals and third and fourth external connection terminals are formed on a surface of the chip; are adhered to each other in a form wherein the surfaces of the chips are opposed to each other, and wherein said first and third inter-chip connection terminals are connected to each other, and said second and fourth inter-chip connection terminals are connected to each other; wherein said first semiconductor chip comprises:
a first multiplexer circuit to which signals from an output terminal of said first circuit block and from said first external connection terminal are inputted and which selects either one of the signals inputted to the first multiplexer circuit based on a first operation mode setting signal so that the selected signal is outputted to said first inter-chip connection terminal; and
a first demultiplexer circuit to which a signal from said second inter-chip connection terminal is inputted, and which selects either the input terminal of said first circuit block or said second external connection terminal based on said first operation mode setting signal, and which outputs a signal inputted from said second inter-chip connection terminal to the selected terminal, wherein
said first multiplexer circuit selects a signal from the output terminal of said first circuit block and said first demultiplexer circuit selects an input terminal of said first circuit block when said first operation mode setting signal indicates the normal operation mode, and
said first multiplexer circuit selects a signal from said first external connection terminal and said first demultiplexer circuit selects said second external connection terminal when said first operation mode setting signal indicates a first test mode of said second circuit block, and wherein
said second semiconductor chip comprises:
a second demultiplexer circuit to which a signal is inputted from said third inter-chip connection terminal, and which has an output terminal connected to the input terminal for the normal operation mode of said second circuit block and an output terminal that is connectable to the input terminal for the test mode of said second circuit block and which selects either one of the two output terminals of the second demultiplexer circuit based on a second operation mode setting signal and which outputs a signal inputted from said third inter-chip connection terminal to the selected output terminal;
a second multiplexer circuit to which signals are inputted from the output terminal of said second demultiplexer circuit that is connectable to the input terminal for the test mode of said second circuit and from said third external connection terminal, and which selects either one of the signals inputted to the second multiplexer circuit based on a third operation mode setting signal and which outputs the selected signal to the input terminal for the test mode of said second circuit block;
a third multiplexer circuit, having an input terminal connected to the output terminal for the normal operation mode of said second circuit block and an input terminal that is connectable to the output terminal for the test mode of said second circuit block, which selects either one of the two input terminals of the third multiplexer circuit based on said second operation mode setting signal and which outputs a signal inputted to the selected input terminal to said fourth inter-chip connection terminal; and a third demultiplexer circuit to which a signal is inputted from the output terminal for the test mode of said second circuit block, and which selects either the input terminal of said third multiplexer circuit that is connectable to the output terminal for the test mode of said second circuit block or said fourth external connection terminal based on said third operation mode setting signal and which outputs a signal inputted from the output terminal for the test mode of said second circuit block to the selected terminal, wherein said second demultiplexer circuit selects the output terminal connected to the input terminal for the normal operation mode of said second circuit block, and said third multiplexer circuit selects the input terminal connected to the output terminal for the normal operation mode of said second circuit block, when said second operation mode setting signal indicates the normal operation mode, said second demultiplexer circuit selects the output terminal that is connectable to the input terminal for the test mode of said second circuit block, and said third multiplexer circuit selects the input terminal that is connectable to the output terminal for the test mode of said second circuit block, when said second operation mode setting signal indicates said first test mode of said second circuit block, said second multiplexer circuit selects a signal from an output terminal of said second demultiplexer circuit, and said third demultiplexer circuit selects an input terminal of said third multiplexer circuit, when said third operation mode setting signal indicates said first test mode of said second circuit block, and said second multiplexer circuit selects a signal from said third external connection terminal, and said third demultiplexer circuit selects said fourth external connection terminal, when said third operation mode setting signal indicates a second test mode of said second circuit block.

28. The semiconductor device according to claim 27, wherein said first semiconductor chip comprises:

fifth and sixth external connection terminals;

a fourth demultiplexer circuit, inserted between the output terminal of said first circuit block and said first multiplexer circuit, to which an output signal of said first circuit block is inputted and which selects either said first multiplexer circuit or said fifth external connection terminal based on a fourth operation mode setting signal and which outputs an output signal from said first circuit block, that is inputted, to the selected circuit or the selected terminal; and a fourth multiplexer circuit, inserted between the input terminal of said first circuit block and said first demultiplexer circuit, to which an output signal from said first demultiplexer circuit and a signal from said sixth external connection terminal are inputted, and which selects either of the signals inputted to the fourth multiplexer circuit based on said fourth operation mode setting signal and which outputs the selected signal to said first circuit block, wherein said fourth demultiplexer circuit selects said first multiplexer circuit, and fourth multiplexer circuit selects an output signal from said first demultiplexer circuit, when said fourth operation mode setting signal indicates the normal operation mode, and said fourth demultiplexer circuit selects said fifth external connection terminal, and said fourth multiplexer circuit selects a signal from said sixth external connection terminal, when said fourth operation mode setting signal indicates the test mode of said first circuit block.

29. The semiconductor device according to claim 27, wherein said first semiconductor chip comprises a first operation mode setting circuit for outputting said first operation mode setting signal to said first multiplexer circuit and to said first demultiplexer circuit; and said second semiconductor chip comprises a second operation mode setting circuit for outputting said second operation mode setting signal to said second demultiplexer circuit and to said third multiplexer circuit and for outputting said third operation mode setting signal to said second multiplexer circuit and to said third demultiplexer circuit.

30. The semiconductor device according to claim 28, wherein said first semiconductor chip comprises a first operation mode setting circuit for outputting said first operation mode setting signal to said first multiplexer circuit and to said first demultiplexer circuit and for outputting said fourth operation mode setting signal to said fourth demultiplexer circuit and to said fourth multiplexer circuit; and said second semiconductor chip comprises a second operation mode setting circuit for outputting said second operation mode setting signal to said second demultiplexer circuit and to said third multiplexer circuit and for outputting said third operation mode setting signal to said second multiplexer circuit and to said third demultiplexer circuit.

* * * * *